(12) United States Patent
Nishimura et al.

(10) Patent No.: US 9,983,272 B2
(45) Date of Patent: May 29, 2018

(54) MAGNETISM DETECTION DEVICE

(71) Applicant: ROHM CO., LTD., Kyoto-shi, Kyoto (JP)

(72) Inventors: Isamu Nishimura, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 214 days.

(21) Appl. No.: 14/965,312

(22) Filed: Dec. 10, 2015

(65) Prior Publication Data

US 2016/0187433 A1 Jun. 30, 2016

(30) Foreign Application Priority Data

Dec. 26, 2014 (JP) ................................. 2014-264392

(51) Int. Cl.
*G01R 33/06* (2006.01)
*G01R 33/00* (2006.01)
*G01R 33/035* (2006.01)

(52) U.S. Cl.
CPC ....... *G01R 33/063* (2013.01); *G01R 33/0052* (2013.01); *G01R 33/0354* (2013.01)

(58) Field of Classification Search
CPC ...... B82Y 25/00; G01R 33/063; G01R 33/00; G01R 33/0052; G01R 33/06; G01R 33/035; G01R 33/0354
See application file for complete search history.

(56) References Cited

U.S. PATENT DOCUMENTS

| 8,339,132 | B2 | 12/2012 | Honkura et al. | |
| 2011/0291649 | A1* | 12/2011 | Honkura | G01R 33/0052 324/244 |
| 2012/0013332 | A1* | 1/2012 | Honkura | G01C 17/30 324/244 |
| 2013/0181705 | A1* | 7/2013 | Honkura | G01R 33/063 324/252 |
| 2016/0116551 | A1* | 4/2016 | Honkura | G01R 33/063 324/258 |
| 2017/0160351 | A1* | 6/2017 | Yamamoto | G01R 33/063 |

FOREIGN PATENT DOCUMENTS

WO 2010/110456 A1 9/2010

* cited by examiner

*Primary Examiner* — Son Le
(74) *Attorney, Agent, or Firm* — Hamre, Schumann, Mueller & Larson, P.C.

(57) ABSTRACT

Provided is a magnetism detection device by which it is possible to achieve a reduction in size and an increase in accuracy. A magnetism detection device includes: a magneto-impedance element; a magnetic field direction changing body; and a substrate that is formed of a semiconductor material and has an element arrangement recessed portion bottom surface and a back surface that face mutually opposite sides in a thickness direction, and a through-hole that reaches the element arrangement recessed portion bottom surface and the back surface and has a cross-sectional dimension that increases toward the main surface starting from the element arrangement recessed portion bottom surface. The magneto-impedance element is mounted on the element arrangement recessed portion bottom surface, and the magnetic field direction changing body is accommodated in the through-hole.

29 Claims, 12 Drawing Sheets

MAGNETISM DETECTION DEVICE

BACKGROUND OF THE INVENTION

1. Field of the Invention

The present invention relates to a magnetism detection device.

2. Description of Related Art

A magnetism detection device that uses a magneto-impedance element has been proposed as a magnetism detection device for sensing direction. The magneto-impedance element is provided with a wire made of an amorphous material, and a coil accommodating the wire. The magneto-impedance element uses a magneto-impedance effect in which impedance changes due to the skin effect when a high-frequency pulse current flows in the wire. Furthermore, in JP 2010/110456A1, a configuration is proposed in which a magneto-impedance element and a magnetic direction changing body are combined. The magnetic direction changing body performs a function of causing a response in the wire by changing the direction of an external magnetic field, such as that of the Earth, in a direction different from that of the wire. This makes it possible to detect magnetism in two directions with one magneto-impedance element.

However, the detection accuracy of a magnetism detection apparatus provided with a magneto-impedance element and a magnetic direction changing element significantly depends on the relative positional relationship between the magneto-impedance element and the magnetic direction changing body. That is, it is preferable to arrange them as close to each other as possible, and to prevent positional misalignment and the like to the greatest extent possible. Also, applications in which magnetism detection devices are mounted in mobile phones, for example, are being used widely, and there is demand for a further reduction in size.

SUMMARY OF THE INVENTION

The present invention is conceived of in the above-described situation, and aims to provide a magnetism detection device by which it is possible to achieve a reduction in size and an increase in accuracy.

A magnetism detection device provided by an embodiment of the disclosure includes: at least one magneto-impedance element; a magnetic field direction changing body; and a substrate that is formed of a semiconductor material and has a mounting surface and a back surface that face mutually opposite sides in a thickness direction, and at last one through-hole that reaches the mounting surface and the back surface and has a cross-sectional dimension that increases toward the back surface starting from the mounting surface. The magneto-impedance element is mounted on the mounting surface, and the magnetic field direction changing body is accommodated in the through-hole.

In a preferred embodiment of the present invention, the substrate further includes a main surface facing a side opposite to the back surface, and an element arrangement recessed portion that is recessed from the main surface and has an element arrangement recessed portion bottom surface, and the mounting surface is the element arrangement recessed portion bottom surface.

In a preferred embodiment of the present invention, the element arrangement recessed portion bottom surface is orthogonal to the thickness direction.

In a preferred embodiment of the present invention, the element arrangement recessed portion has an element arrangement recessed portion first side surface that rises from the element arrangement recessed portion bottom surface.

In a preferred embodiment of the present invention, the element arrangement recessed portion first side surface is inclined with respect to the thickness direction.

In a preferred embodiment of the present invention, the element arrangement recessed portion has an element arrangement recessed portion intermediate surface that is connected to the element arrangement first side surface and faces the same side as the element arrangement recessed portion bottom surface.

In a preferred embodiment of the present invention, the magnetism detection device further includes a control element configured to perform magnetism detection control using the magneto-impedance element. The control element is mounted on the element arrangement recessed portion intermediate surface.

In a preferred embodiment of the present invention, the element arrangement recessed portion has an element arrangement recessed portion second side surface that rises from the element arrangement recessed portion intermediate surface.

In a preferred embodiment of the present invention, the element arrangement recessed portion second side surface is inclined with respect to the thickness direction.

In a preferred embodiment of the present invention, the element arrangement recessed portion is rectangular in a view in the thickness direction.

In a preferred embodiment of the present invention, the magnetic detection device further includes an insulating layer formed on the substrate and a conducting layer that is formed on the insulating layer and electrically connects to the magneto-impedance element and the control element.

In a preferred embodiment of the present invention, the insulating layer comprises $SiO_2$ or $SiN$.

In a preferred embodiment of the present invention, the insulating layer includes a recessed portion inner surface insulating portion formed on an inner surface of the element arrangement recessed portion.

In a preferred embodiment of the present invention, the conducting layer is formed over the element arrangement recessed portion bottom surface, the element arrangement recessed portion first side surface, and the element arrangement recessed portion intermediate surface.

In a preferred embodiment of the present invention, the conducting layer is formed over the element arrangement recessed portion intermediate surface, the element arrangement recessed portion second side surface, and the main surface.

In a preferred embodiment of the present invention, the magnetic field direction changing body fills an entire inner space of the through-hole.

In a preferred embodiment of the present invention, the magnetic field direction changing body is formed of a soft magnetic body.

In a preferred embodiment of the present invention, the soft magnetic body is a permalloy.

In a preferred embodiment of the present invention, the magneto-impedance element includes at least one wire and at least one coil that is insulated from the wire and in which the wire is accommodated.

In a preferred embodiment of the present invention, wire is arranged along the mounting surface.

In a preferred embodiment of the present invention, the device further includes an additional coil in which the wire is accommodated, and the additional coil is arranged apart from the at least one coil in a longitudinal direction of the wire.

In a preferred embodiment of the present invention, the magneto-impedance element includes an additional wire arranged parallel to the at least one wire.

In a preferred embodiment of the present invention, the at least one coil and the additional coil accommodate the additional wire.

In a preferred embodiment of the present invention, the device further includes an additional magneto-impedance element. The substrate has an additional through-hole, and the two magneto-impedance elements correspond to the two through-holes and have mutually different detection directions.

In a preferred embodiment of the present invention, the two magneto-impedance elements are both arranged on the element arrangement recessed portion.

In a preferred embodiment of the present invention, the substrate is formed of a single-crystal semiconductor material.

In a preferred embodiment of the present invention, the semiconductor material is Si.

In a preferred embodiment of the present invention, the mounting surface and the back surface are orthogonal to the thickness direction of the substrate and are flat.

In a preferred embodiment of the present invention, the mounting surface and the back surface are (100) surfaces.

According to the embodiments, the magnetic field direction changing body is accommodated in the through-hole with a cross-sectional dimension that increases toward the back surface starting from the mounting surface. According to this, the density of the magnetic flux is increased at the portion of the magnetic field direction changing body on the mounting surface side, and the direction of the magnetic flux is changed so as to spread out significantly from the end portion of the magnetic field direction changing body to the outside. This makes it possible to more accurately detect magnetism along the thickness direction of the substrate and magnetism in the detection direction of the magneto-impedance element, which is different from the thickness direction. Also, by making the cross-section of the mounting surface side of the magnetic field direction changing body smaller, a smaller-sized magneto-impedance element can be used as the magneto-impedance element arranged in correspondence therewith. This makes it possible to reduce the size and increase the accuracy of the magnetism detection device.

Other features and advantages of the present invention will become apparent from the detailed description given below with reference to the accompanying drawings.

DESCRIPTION OF THE PREFERRED EMBODIMENTS

Hereinafter, preferred embodiments of the present invention will be described in detail with reference to the drawings.

Figure 1:
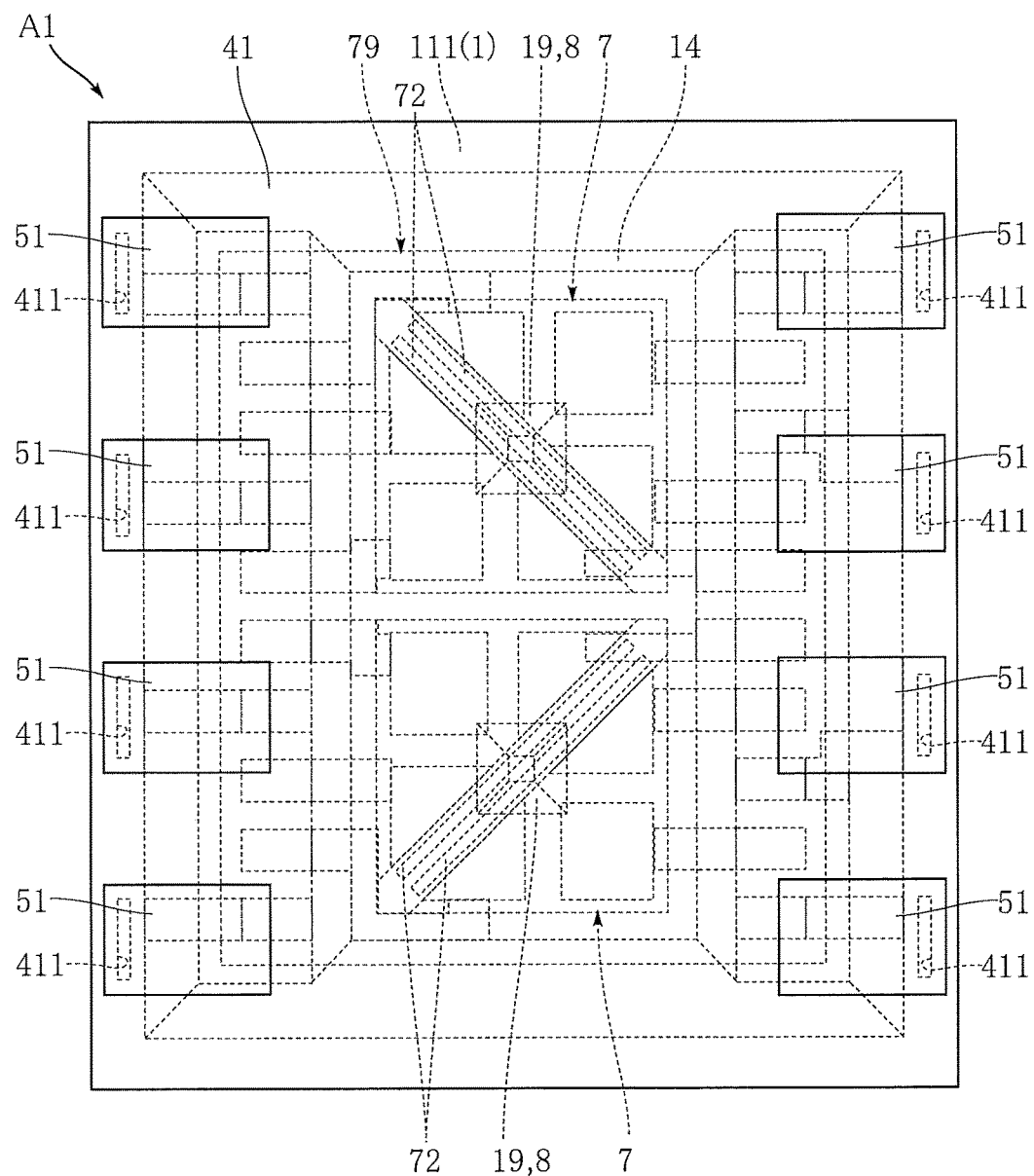
FIG. 1 is a plan view showing an example of a magnetism detection device according to the present invention.
Figure 2:
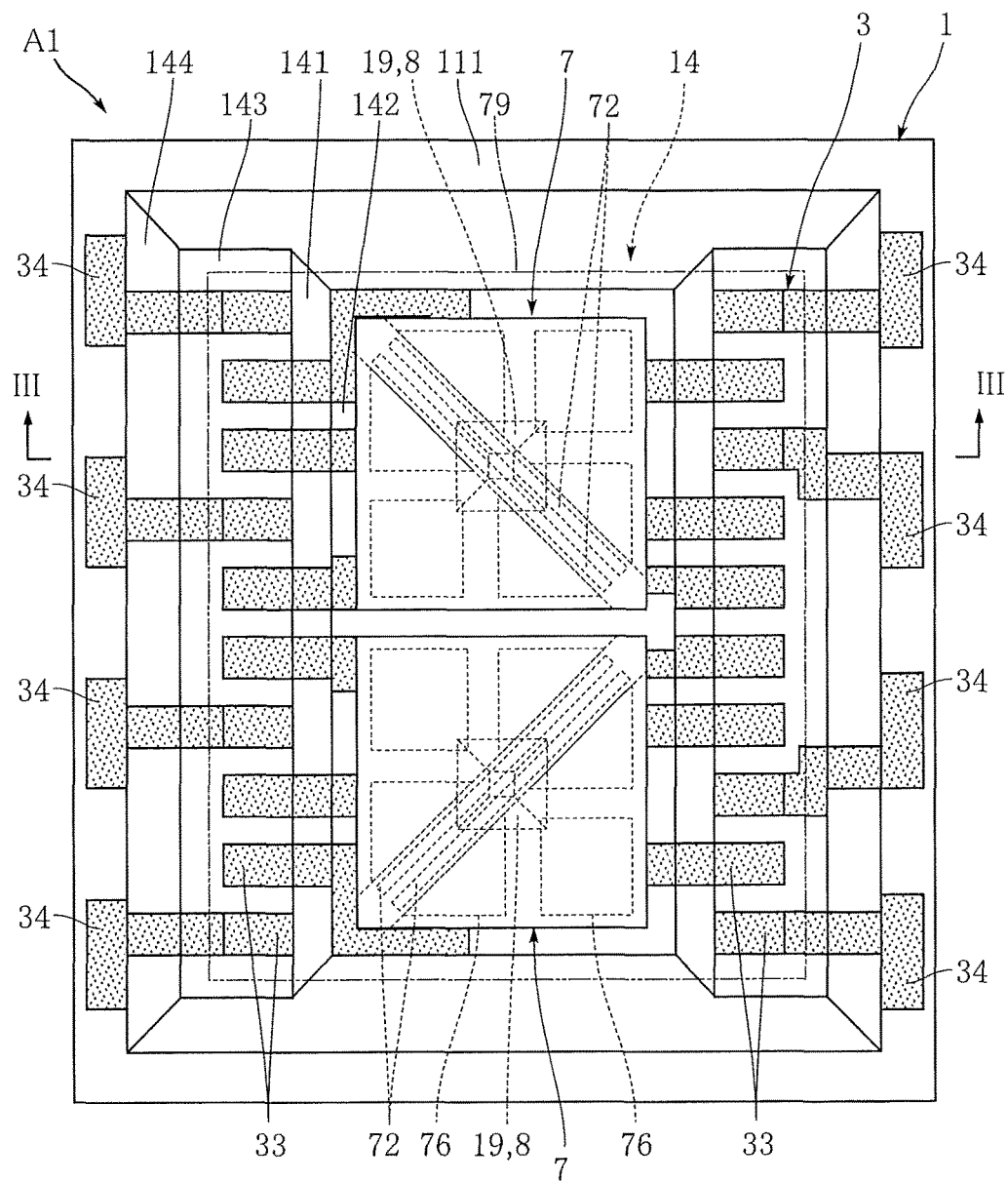
FIG. 2 is a plan view showing relevant portions of the magnetism detection device shown in FIG. 1.
Figure 3:
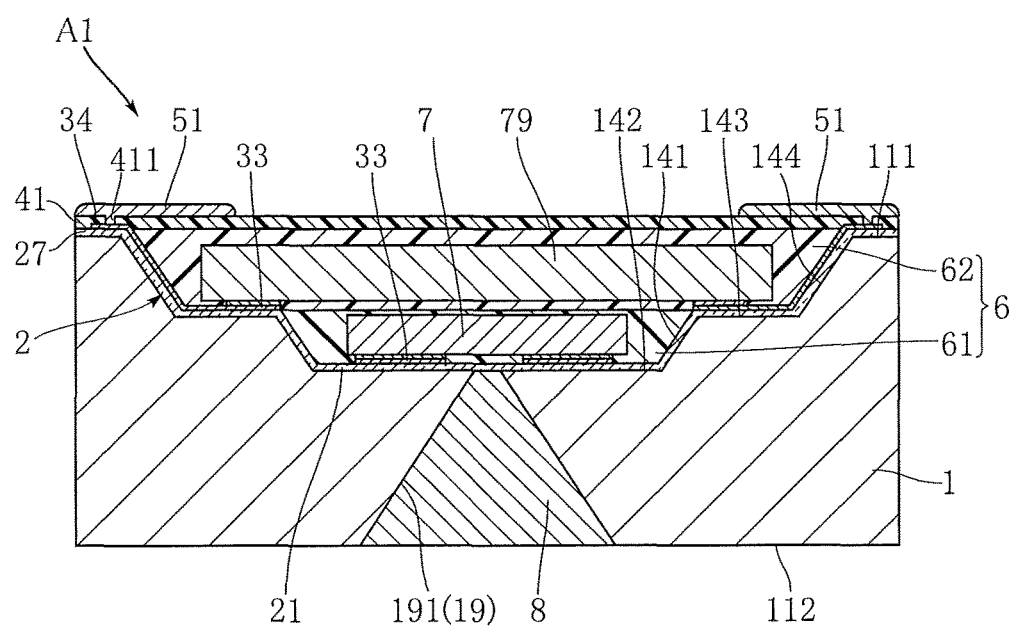
FIG. 3 is a cross-sectional view taken along line III-III in FIG. 2.

FIGS. 1 to 3 show an example of a magnetism detection device according to the present invention. A magnetism detection device A1 of the present embodiment is provided with a substrate 1, an insulating layer 2, a conducting layer 3, a main surface side insulating film 41, main surface electrode pads 51, a sealing resin portion 6, two magneto-impedance elements 7, a control element 79, and magnetic field direction changing bodies 8. The magnetism detection device A1 is mounted in a mobile telephone or the like and is used for sensing direction, for example. The magnetism detection device A1 has a rectangular shape and a side with a length of about 1.2 to 1.4 mm in plan view, for example.

FIG. 1 is a plan view showing the magnetism detection device A1. FIG. 2 is a plan view showing relevant portions of the magnetism detection device A1, in which the insulating layer 2, the main surface side insulating film 41, and the main surface electrode pads 51 have been omitted for ease of comprehension. FIG. 3 is a cross-sectional view taken along line III-III in FIG. 2.

The substrate 1 is formed of a single-crystal semiconductor material. The substrate 1 is formed of single-crystal Si in the present embodiment. The material of the substrate 1 is not limited to being Si, and may be SiC, for example. The thickness of the substrate 1 is about 480 µm, for example. The magneto-impedance elements 7 and the control element 79 are arranged on the substrate 1.

Figure 4:
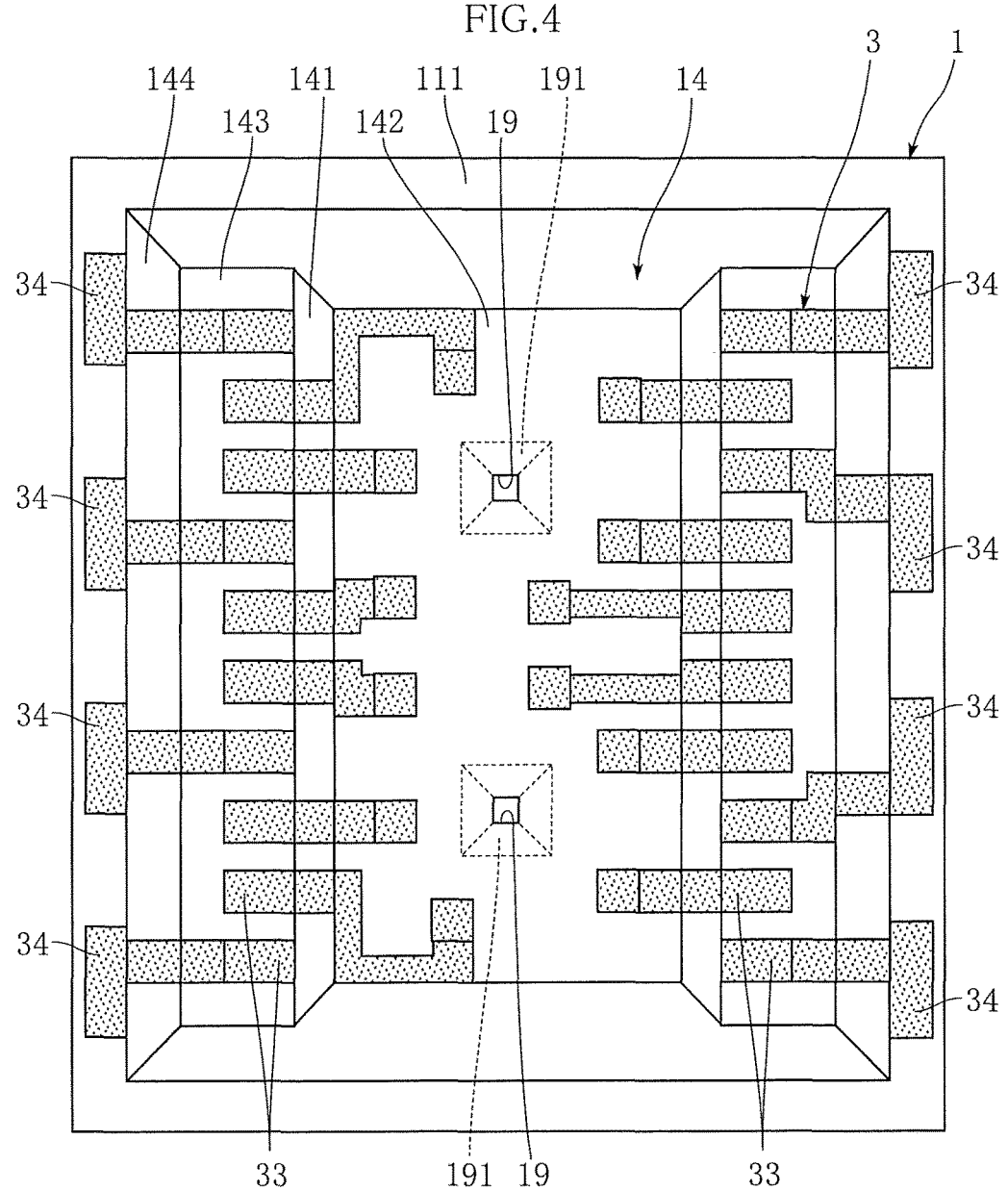
FIG. 4 is a plan view showing a substrate of the magnetism detection device shown in FIG. 1.

The substrate 1 has a main surface 111 and a back surface 112. Note that FIG. 4 is a plan view showing the substrate 1.

The main surface 111 faces one side in the thickness direction. The main surface 111 is flat. The main surface 111 is orthogonal to the thickness direction. The main surface 111 is a (100) surface or a (110) surface. In the present embodiment, the main surface ill is a (100) surface.

The back surface 112 faces the other side in the thickness direction. That is, the back surface 112 and the main surface 111 face mutually opposite sides. The back surface 112 is flat. The back surface 112 is orthogonal to the thickness direction.

An element arrangement recessed portion 14 and two through-holes 19 are formed in the substrate 1.

The element arrangement recessed portion 14 is recessed from the main surface 111. The magneto-impedance elements 7 and the control element 79 are arranged in the element arrangement recessed portion 14. The depth of the element arrangement recessed portion 14 (distance between the main surface 111 and a later-described element arrangement recessed portion bottom surface 142 in the thickness direction) is about 220 µm, for example. The element arrangement recessed portion 14 is rectangular in a view in the thickness direction. The shape of the element arrangement recessed portion 14 depends on the fact that a (100) surface is used as the main surface 111.

The element arrangement recessed portion 14 has element arrangement recessed portion first side surfaces 141, an element arrangement recessed portion bottom surface 142, an element arrangement recessed portion intermediate surface 143, and element arrangement recessed portion second side surfaces 144.

The element arrangement recessed portion bottom surface 142 faces the same side as the main surface 111 in the thickness direction of the substrate 1. The element arrangement recessed portion bottom surface 142 is rectangular in a view in the thickness direction. The magneto-impedance elements 7 are arranged on the element arrangement recessed portion bottom surface 142. The element arrangement recessed portion bottom surface 142 is a surface that is orthogonal to the thickness direction.

The element arrangement recessed portion first side surfaces 141 rise from the element arrangement recessed portion bottom surface 142. The element arrangement recessed portion first side surfaces 141 are connected to the element arrangement recessed portion bottom surface 142. The element arrangement recessed portion first side surfaces 141 are inclined with respect to the thickness direction. The angle of the element arrangement recessed portion first side surfaces 141 with respect to a plane orthogonal to the thickness direction is 55 degrees. This is due to the fact that a (100) surface is used as the main surface 111. The element arrangement recessed portion first side surfaces 141 are four flat surfaces.

The element arrangement recessed portion intermediate surface 143 is connected to the element arrangement recessed portion bottom surface 142. The element arrangement recessed portion intermediate surface 143 faces the same side as the main surface 111 in the thickness direction. The element arrangement recessed portion intermediate surface 143 has two band-shaped portions that are parallel to each other in a view in the thickness direction, and is a flat surface.

The element arrangement recessed portion second side surfaces 144 rise from the element arrangement recessed portion intermediate surface 143. The element arrangement recessed portion second side surfaces 144 are connected to the main surface 111. The element arrangement recessed portion second side surfaces 144 are inclined with respect to the thickness direction. The angle of the element arrangement recessed portion second side surfaces 144 with respect to a plane orthogonal to the thickness direction is 55 degrees. This is due to the fact that a (100) surface is used as the main surface 111. The element arrangement recessed portion second side surfaces 144 are four flat surfaces. Note that two of the element arrangement recessed portion first side surfaces 141 are respectively continuous with two of the element arrangement recessed portion second side surfaces 144.

The through-holes 19 each penetrate a portion of the substrate 1 from the element arrangement recessed portion bottom surface 142 to the back surface 112. In the present embodiment, there are two through-holes 19, which are arranged apart from each other in the side direction of the element arrangement recessed portion 14, which is rectangular in plan view. The depth of the through-holes 19 is about 260 µm, for example. The opening dimension of the through-holes 19 at the back surface 112 in a view in the thickness direction of the substrate 1 is about 420 µm, for example. In the present embodiment, the through-holes 19 are rectangular in a view in the thickness direction. Also, in the present embodiment, the cross-sectional dimensions of the through-holes 19 increase toward the back surface 112 starting from the main surface 111 in the thickness direction.

The through-holes 19 each have through-hole inner surfaces 191.

The through-hole inner surfaces 191 are inclined with respect to the thickness direction of the substrate 1. The through-hole inner surfaces 191 are four flat surfaces. In the present embodiment, the through-hole inner surfaces 191 are connected to the element arrangement recessed portion bottom surface 142 and the back surface 112. The angle of the through-hole inner surfaces 191 with respect to a plane orthogonal to the thickness direction is 55 degrees. This is due to the fact that a (100) surface is used as the main surface 111.

The insulating layer 2 is interposed between the conducting layer 3 and the substrate 1. The thickness of the insulating layer 2 is about 0.1 to 1.0 µm, for example. The insulating layer 2 is formed of $SiO_2$ or SiN, for example.

The insulating layer 2 has a recessed portion inner surface insulating portion 21 and a main surface side insulating portion 27.

The recessed portion inner surface insulating portion 21 is formed in the element arrangement recessed portion 14 of the substrate 1. In the present embodiment, the recessed portion inner surface insulating portion 21 is formed on all of the element arrangement recessed portion first side surfaces 141, the element arrangement recessed portion bottom surface 142, the element arrangement recessed portion intermediate surface 143, and the element arrangement recessed portion second side surfaces 144. The recessed portion inner surface insulating portion 21 is formed through thermal oxidation, for example. The recessed portion inner surface insulating portion 21 is formed of $SiO_2$, for example.

The main surface side insulating portion 27 is formed on the main surface 111 of the substrate 1. The main surface side insulating portion 27 is formed of SiO$_2$, for example, similarly to the recessed portion inner surface insulating portion 21.

The conducting layer 3 is electrically connected to the magneto-impedance elements 7 and the control element 79. The conducting layer 3 is for forming a current path for performing input to and output from the magneto-impedance elements 7 and the control element 79. The conducting layer 3 is formed on the element arrangement recessed portion first side surfaces 141, the element arrangement recessed portion bottom surface 142, the element arrangement recessed portion intermediate surface 143, the element arrangement recessed portion second side surfaces 144, and the main surface 111.

The conducting layer 3 includes a seed layer and a plating layer, for example.

The seed layer is a so-called underlying layer for forming a desired plating layer. The seed layer is interposed between the substrate 1 and the plating layer. The seed layer is formed of Cu, for example. The seed layer is formed through sputtering, for example. The thickness of the seed layer is 1 μm or less, for example.

The plating layer is formed through electrolytic plating using the seed layer. The plating layer is formed of Cu or a layer in which Ti, Ni, Cu, and the like are stacked, for example. The thickness of the plating layer is about 3 to 10 μm, for example. The thickness of the plating layer is thicker than the thickness of the seed layer.

The conducting layer 3 includes element arrangement recessed portion pads 33 and main surface side pads 34.

The element arrangement recessed portion pads 33 include pads formed in the element arrangement recessed portion 14, and in particular, formed on the element arrangement recessed portion bottom surface 142. Also, the element arrangement recessed portion pads 33 may include pads formed on the element arrangement recessed portion intermediate surface 143. The element arrangement recessed portion pads 33 formed on the element arrangement recessed portion bottom surface 142 are used for mounting the magneto-impedance elements 7 on the element arrangement recessed portion bottom surface 142. The element arrangement recessed portion pads 33 formed on the element arrangement recessed portion intermediate surface 143 are used for mounting the control element 79 on the element arrangement recessed portion intermediate surface 143.

The main surface side pads 34 are formed on the main surface 111 and are used for providing the main surface electrode pads 51. In the present embodiment, multiple main surface side pads 34 are arranged along the two sides of the element arrangement recessed portion 14, which is rectangular in plan view.

Also, the conducting layer 3 includes a band-shaped portion for electrically connecting the element arrangement recessed portion pads 33 and the main surface side pads 34 as necessary.

The main surface side insulating film 41 is formed on the main surface 111. The conducting layer 3 is interposed between the main surface side insulating film 41 and the substrate 1. The main surface side insulating film 41 is formed of SiN, for example. The main surface side insulating film 41 is formed through CVD, for example. Also, through-holes 411 are formed in the main surface side insulating film 41. The through-holes 411 penetrate the main surface side insulating film 41 in the thickness direction and overlap with the main surface side pads 34 of the conducting layer 3 in plan view.

The main surface electrode pads 51 are formed on the main surface side insulating film 41 and are arranged at positions that overlap with the main surface 111 and the element arrangement recessed portion 14 in plan view. The main surface electrode pads 51 are in contact with the main surface side pads 34 of the conducting layer 3 through the through-holes 411. Also, the main surface electrode pads 51 are electrically connected to the control element 79. The main surface electrode pads 51 each have a structure in which a Ni layer, a Pd layer, and a Au layer, in order of closeness to the substrate 1, for example, are stacked. In the present embodiment, the main surface electrode pads 51 are rectangular.

The sealing resin portion 6 fills the element arrangement recessed portion 14 and covers the magneto-impedance elements 7 and the control element 79. The sealing resin portion 6 includes a first sealing resin portion 61 and a second sealing resin portion 62. The first sealing resin portion 61 covers the magneto-impedance elements 7 and fills the space surrounded by the element arrangement recessed portion bottom surface 142 and the element arrangement recessed portion first side surfaces 141. The second sealing resin portion 62 covers the control element 79 and fills the space surrounded by the element arrangement recessed portion intermediate surface 143 and the element arrangement recessed portion second side surfaces 144. Examples of the material of the sealing resin portion 6 include epoxy resin, phenol resin, polyimide resin, polybenzoxazole (PBO) resin, and silicone resin. The sealing resin portion 6 may be either translucent resin or non-translucent resin, but in the present embodiment, non-translucent resin is preferable.

The magneto-impedance elements 7 are elements that detect magnetism using a magneto-impedance effect. As shown in FIG. 2, the magneto-impedance elements 7 are arranged so as to overlap the through-holes 19 in plan view, and in the present embodiment, the centers thereof are roughly in alignment.

Figure 5:
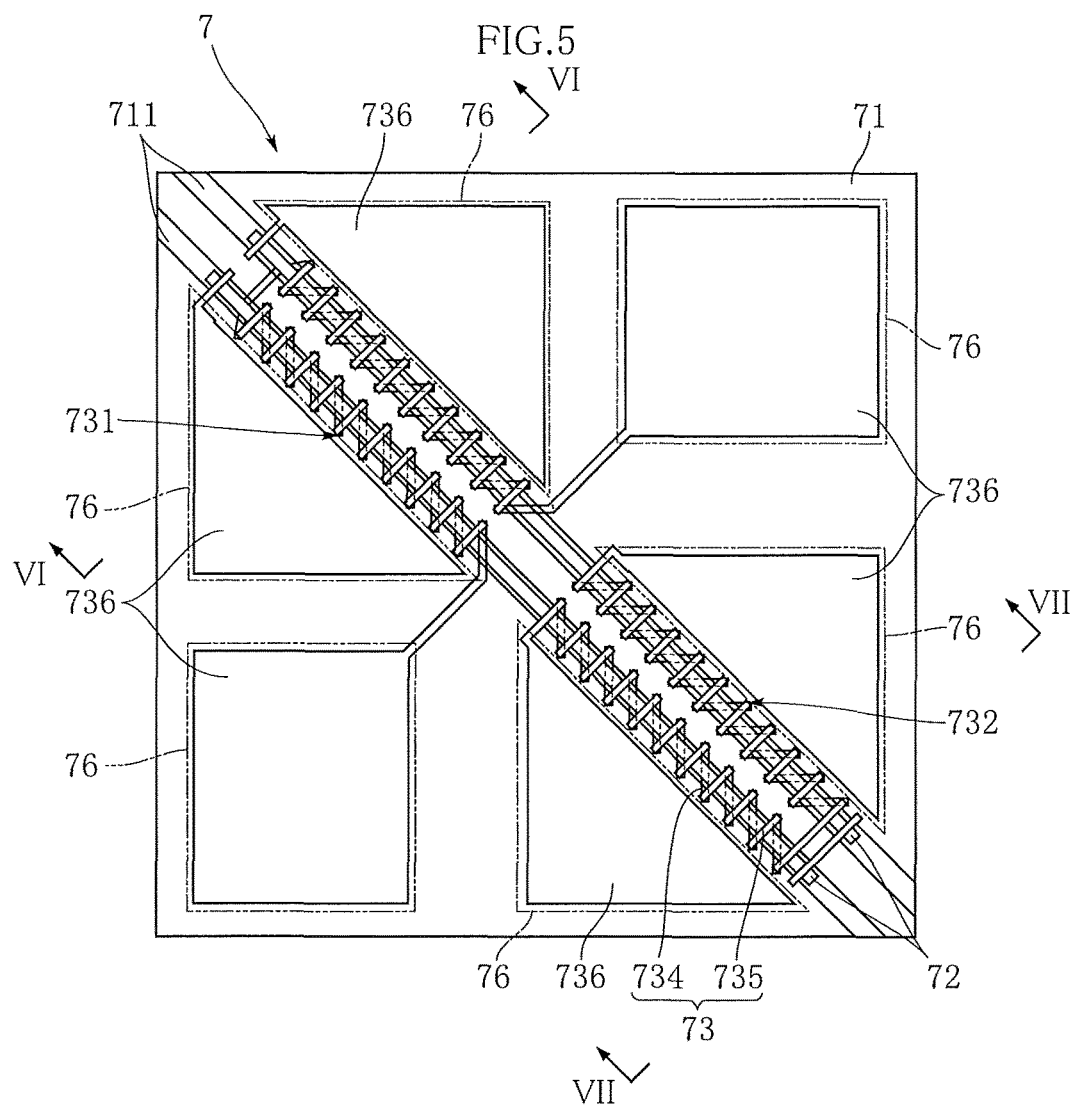
FIG. 5 is a plan view showing relevant portions of a magneto-impedance element of the magnetism detection device shown in FIG. 1.
Figure 6:
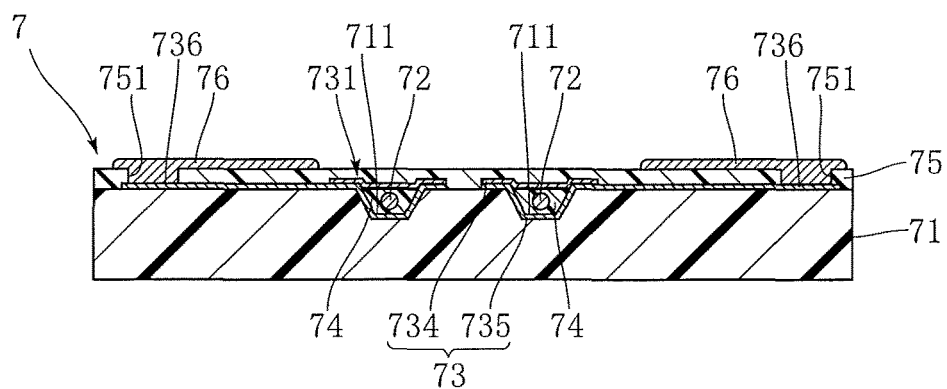
FIG. 6 is a cross-sectional view taken along line VI-VI in FIG. 5.
Figure 7:
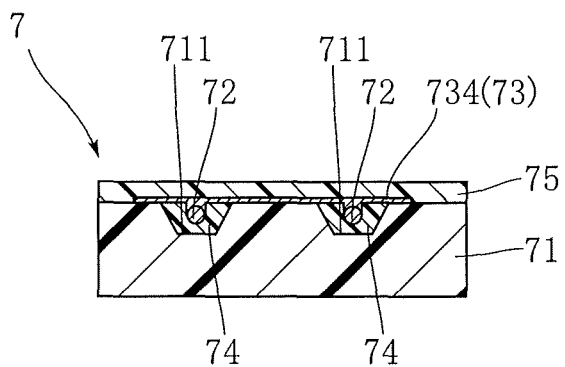
FIG. 7 is a cross-sectional view taken along line VII-VII in FIG. 5.

FIG. 5 is a plan view showing relevant portions of a magneto-impedance element 7. FIG. 6 is a cross-sectional view taken along line VI-VI in FIG. 5. FIG. 7 is a cross-sectional view taken along line VII-VII in FIG. 5.

The magneto-impedance element 7 is provided with an element substrate 71, two wires 72, a coil 731, a coil 732, an insulating portion 74, an insulating film 75, and multiple electrode pads 76.

The element substrate 71 serves as the base for the magneto-impedance element 7, is formed of a material having at least a surface that has insulating properties, and is a Si substrate provided with an insulating layer formed of SiO$_2$ or the like at suitable locations, for example. In the present embodiment, the element substrate 71 is rectangular in plan view. Two groove portions 711 are formed on the element substrate 71. The groove portions 711 are arranged so as to extend parallel to each other and be adjacent to each other with a slight gap therebetween. Also, in the present embodiment, the two groove portions 711 extend in a diagonal direction of the element substrate 71.

The wires 72 determine the direction in which the magneto-impedance element 7 detects magnetism. The wires 72 are magnetosensitive bodies whose impedance and magnetic flux amount change in response to magnetism, and in the present embodiment, they are formed of an amorphous material, for example. The wire 72 is circular in cross-section, for example. The two wires 72 are stored individually in the two groove portions 711 of the element substrate 71.

Note that as shown in FIG. 2, the directions in which the wires 72 of the two magneto-impedance elements 7 extend (detection directions) are mutually different, and in the present embodiment, they are at a right angle to each other.

The coil 731 and the coil 732 are detection means for detecting an amount of change in the wires 72 serving as magnetosensitive bodies. The coil 731 accommodates one side in the longitudinal direction of the two wires 72. The coil 732 accommodates the other side of the two wires 72. In the present embodiment, in order to form the coil 731 and the coil 732, the magneto-impedance element 7 is provided with an element conducting layer 73 composed of a lower conducting layer 734 and an upper conducting layer 735. Also, in plan view, the opening portion of the through-hole 19 located toward the element arrangement recessed portion bottom surface 142 of the substrate 1 is arranged between the coil 731 and the coil 732.

The lower conducting layer 734 is a layer formed on the surface of the element substrate 71. The upper conducting layer 735 is formed such that portions thereof are in contact with portions of the lower conducting layer 734, and other portions thereof are separate from and overlap with the lower conducting layer 734. The lower conducting layer 734 and the upper conducting layer 735 are plating layers formed of Cu, for example.

As shown in FIG. 6, in the coil 731 and the coil 732, a mode is realized in which the multiple band-shaped portions of the lower conducting layer 734 and the multiple band-shaped portions of the upper conducting layer 735 surround the two wires in a spiral shape due to the respective end portions thereof being sequentially brought into contact with each other. Also, as shown in FIG. 7, the end portions of the two wires 72 are connected to each other by a portion of the upper conducting layer 735.

The insulating portion 74 fills the groove portions 711, covers the wires 72, and insulates desired portions of the lower conducting layer 734 and the upper conducting layer 735 from each other. The insulating portion 74 is $SiO_2$, SiN, or the like, for example.

Also, the magneto-impedance elements 7 have multiple pad portions 736. The multiple pad portions 736 are formed by a portion of the lower conducting layer 734 of the element conducting layer 73. In the present embodiment, six pad portions 736 are provided. The coil 731, the coil 732, and the two wires 72 each have two of the pad portions 736 respectively electrically connected thereto.

The insulating film 75 covers one surface of the element substrate 71 and most of the element conducting layer 73. The insulating film 75 is a film formed of an insulating material, and is formed of $SiO_2$, SiN, or the like, for example. Multiple through-holes 751 are formed in the insulating film 75. The through-holes 751 penetrate the insulating film 75 in the thickness direction and overlap with the pad portions 736 in plan view. Accordingly, a portion of each of the multiple pad portions 736 is exposed from the insulating film 75.

The multiple electrode pads 76 are provided on the insulating film 75 and are obtained by stacking Ni and Au, for example. The electrode pads 76 are electrically connected to the pad portions 736 through the through-holes 751 of the insulating film 75. The multiple electrode pads 76 are bonded with solder, for example, to the multiple element arrangement recessed portion pads 33 arranged on the element arrangement recessed portion bottom surface 142 in the magnetism detection device A1.

By changing the direction of a magnetic field in a direction different from the detection direction of the wires 72, which are magnetosensitive bodies, the magnetic field direction changing bodies 8 cause the magneto-impedance elements 7 to realize detection of magnetism in the detection direction of the wires 72 and in a direction different therefrom. The magnetic field direction changing bodies 8 are stored in the through-holes 19 of the substrate 1, and in the present embodiment, the interiors of the through-holes are entirely filled by the magnetic field direction changing bodies 8. The magnetic field direction changing bodies 8 are each formed of a soft magnetic body that can function as a magnetic field direction changing body, and more preferably, are made of a permalloy. The through-holes 19 are each given a square pyramid shape due to the magnetic field direction changing bodies 8 being accommodated therein. In the present embodiment, the distance between the upper end in the drawing of the magnetic field direction changing bodies 8 and the magnetic magneto-impedance elements 7 is about 20 µm.

If the magnetic field along the up-down direction in the drawing exists with respect to the magnetic field direction changing bodies 8, the magnetic flux density is increased inside of the magnetic field direction changing bodies 8, and the direction is changed such that the magnetic flux spreads out above the magnetic field direction changing bodies 8 in the drawing. The density of the magnetic flux that spreads out from the magnetic field direction changing bodies 8 changes depending on the orientation of the magneto-impedance elements 7 with respect to the magnetic field. This change appears when the magnetic intensity detected by the coil 731 and the magnetic intensity detected by the coil 732 become unbalanced. Using this, it is possible to detect magnetism in two directions with one magneto-impedance element 7.

The control element 79 is an element that controls magnetism detection using two magneto-impedance elements 7. That is, the control element 79 performs processing such as transfer of a high-frequency pulse current to the wires 72 of the magneto-impedance elements 7 and detection of voltage generated in the coil 731 and the coil 732. In the present embodiment, the control element 79 is a so-called ASIC (Application Specific Integrated Circuit) element.

Next, an example of a method for manufacturing the magnetism detection device A1 will be described below with reference to FIGS. 8 to 18.

Figure 8:
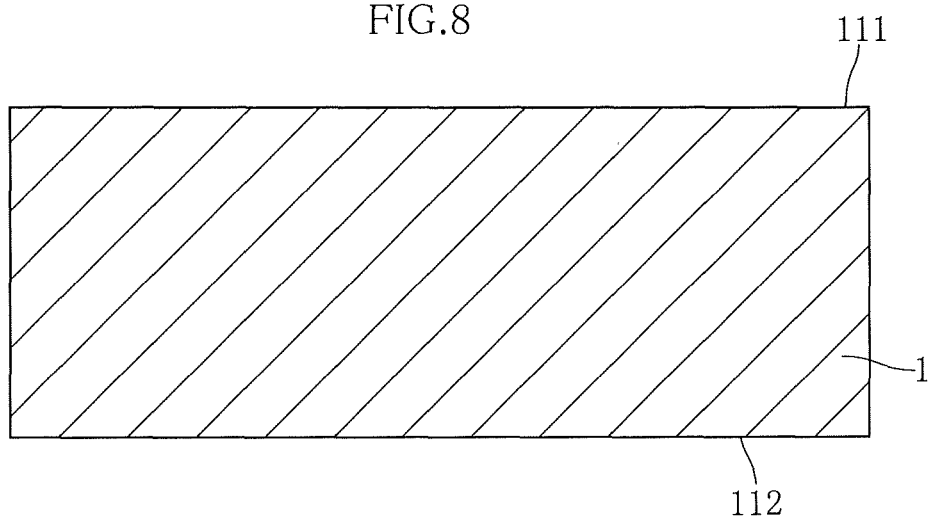
FIG. 8 is a cross-sectional view showing an example of a method for manufacturing the magnetism detection device shown in FIG. 1.

First, the substrate 1 is prepared as shown in FIG. 8. The substrate 1 is formed of a single-crystal semiconductor material, and in the present embodiment, it is formed of single-crystal Si. The thickness of the substrate 1 is about 480 µm, for example. The substrate 1 is of a size such that it is possible to obtain multiple substrates 1 of the above-described magnetism detection device A1. That is to say, the following manufacturing steps are based on a method for manufacturing multiple magnetism detection devices A1 at once. It is possible to use a method for manufacturing one magnetism detection device A1, but considering industrial efficiency, it is practical to use a method for manufacturing multiple magnetism detection devices A1 at once. Strictly speaking, the substrate 1 shown in FIG. 8 is different from the substrate 1 in the magnetism detection device A1, but in order to facilitate understanding, all substrates are indicated as "substrate 1".

The substrate 1 has the main surface 111 and the back surface 112, which face mutually opposite sides. In the present embodiment, a surface whose crystal orientation is (100), that is, a (100) surface, is used as the main surface 111.

Figure 9:
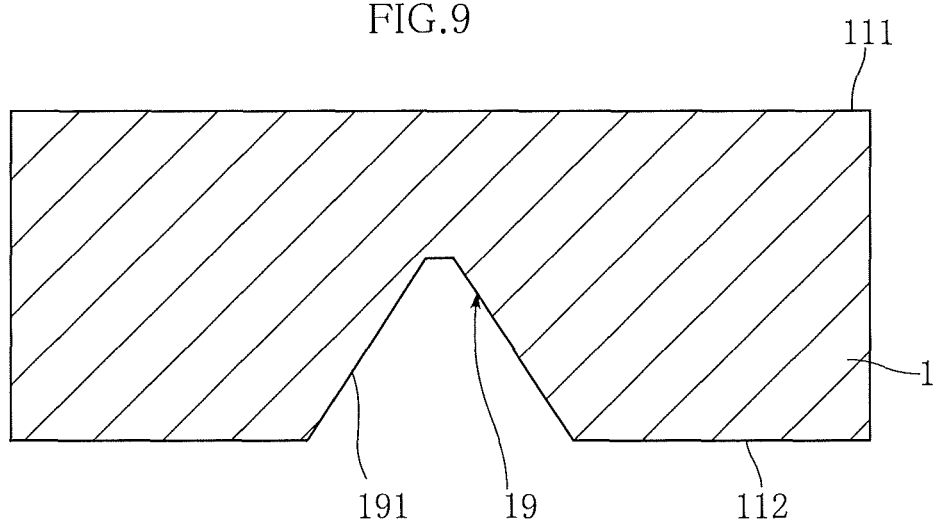
FIG. 9 is a cross-sectional view showing an example of a method for manufacturing the magnetism detection device shown in FIG. 1.

Next, the through-holes 9 are formed as shown in FIG. 9. In this step, a mask layer formed of SiO₂ is formed through, for example, oxidation of the back surface 112. The thickness of the mask layer is around 0.7 to 1.0 μm, for example.

Next, patterning by means of, for example, etching is performed on the mask layer. Accordingly, a rectangular opening, for example, is formed in the mask layer. The shape and size of the opening is set according to the shape and size of the through-hole 19 that is to ultimately be obtained.

Next, anisotropic etching using KOH, for example, is performed on the substrate 1. At this time, the main surface 111 is protected by an oxide film or the like that does not undergo etching. KOH is an example of an alkali etching solution by which favorable anisotropic etching can be realized for single-crystal Si. Accordingly, the through-holes 19 are formed in the substrate 1. The through-holes 19 each have a bottom surface and through-hole inner surfaces 191. The bottom surface is at a right angle to the thickness direction. The angle that the through-hole inner surfaces 191 form with respect to a plane orthogonal to the thickness direction is about 55 degrees.

Figure 10:
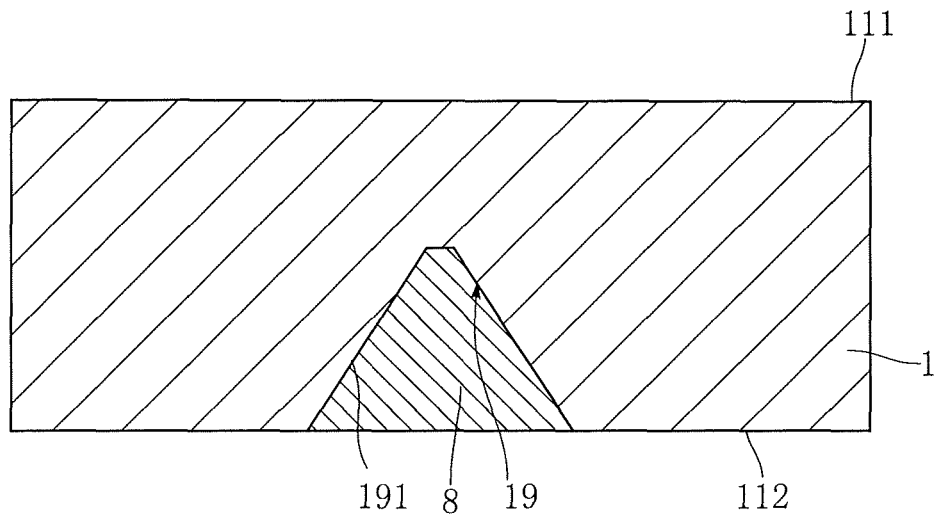
FIG. 10 is a cross-sectional view showing an example of the method for manufacturing the magnetism detection device shown in FIG. 1.

Next, the magnetic field direction changing bodies 8 are formed as shown in FIG. 10. The magnetic field direction changing bodies 8 are formed by preparing a paste that includes a permalloy functioning as a soft magnetic body, for example, and coating the insides of the through-holes 19 with the paste using a squeegee or the like. At this time, it is preferable to entirely fill the interiors of the through-holes 19 with the paste. Then, by firing the paste along with the substrate 1, magnetic field direction changing bodies 8, which are accommodated in the through-holes 19, are obtained.

Next, a mask layer formed of SiO₂ is formed through, for example, oxidation of the main surface 111. The thickness of the mask layer is around 0.7 to 1.0 μm, for example.

Next, patterning by means of, for example, etching is performed on the mask layer. Accordingly, a rectangular opening, for example, is formed in the mask layer. The shape and size of the opening is set according to the shape and size of the element arrangement recessed portion 14 that is to ultimately be obtained.

Next, anisotropic etching using KOH, for example, is performed on the substrate 1. KOH is an example of an alkali etching solution by which favorable anisotropic etching can be realized for single-crystal Si. Accordingly, a recessed portion is formed in the substrate 1. The recessed portion has a bottom surface and side surfaces. The bottom surface is at a right angle to the thickness direction. The angle that the side surfaces form with respect to a plane that is orthogonal to the thickness direction is about 55°.

Figure 11:
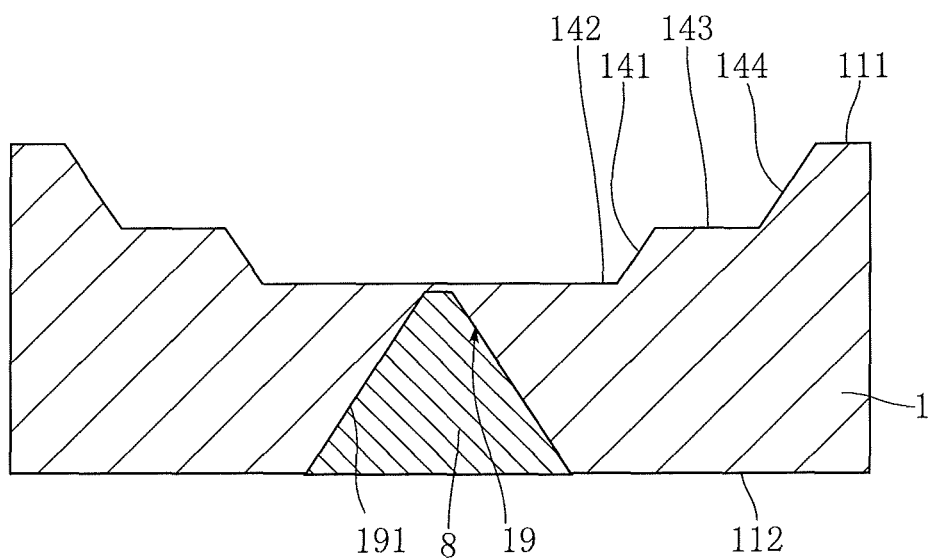
FIG. 11 is a cross-sectional view showing an example of the method for manufacturing the magnetism detection device shown in FIG. 1.

Next, the opening of the mask layer is enlarged. Then, the above-described anisotropic etching using KOH is performed. Next, the mask layer is removed. By performing the two stages of etching, the element arrangement recessed portion 14 shown in FIG. 11 is formed. The element arrangement recessed portion 14 has element arrangement recessed portion first side surfaces 141, an element arrangement recessed portion bottom surface 142, an element arrangement recessed portion intermediate surface 143, and element arrangement recessed portion second side surfaces 144, and is recessed from the main surface 111. The element arrangement recessed portion 14 is rectangular in a view in the thickness direction.

Figure 12:
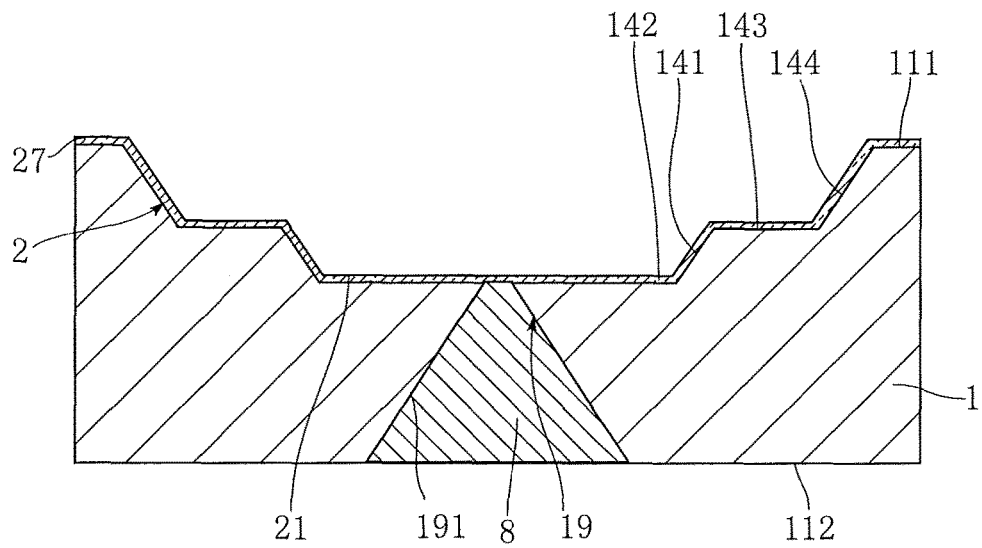
FIG. 12 is a cross-sectional view showing an example of the method for manufacturing the magnetism detection device shown in FIG. 1.

Next, as shown in FIG. 12, the insulating layer 2 is formed on the main surface 111, the element arrangement recessed portion first side surfaces 141, the element arrangement recessed portion bottom surface 142, the element arrangement recessed portion intermediate surface 143, and the element arrangement recessed portion second side surfaces 144 through thermal oxidation. The insulating layer 2 is to be the above-described recessed portion inner surface insulating portion 21 and the main surface side insulating portion 27.

Figure 13:
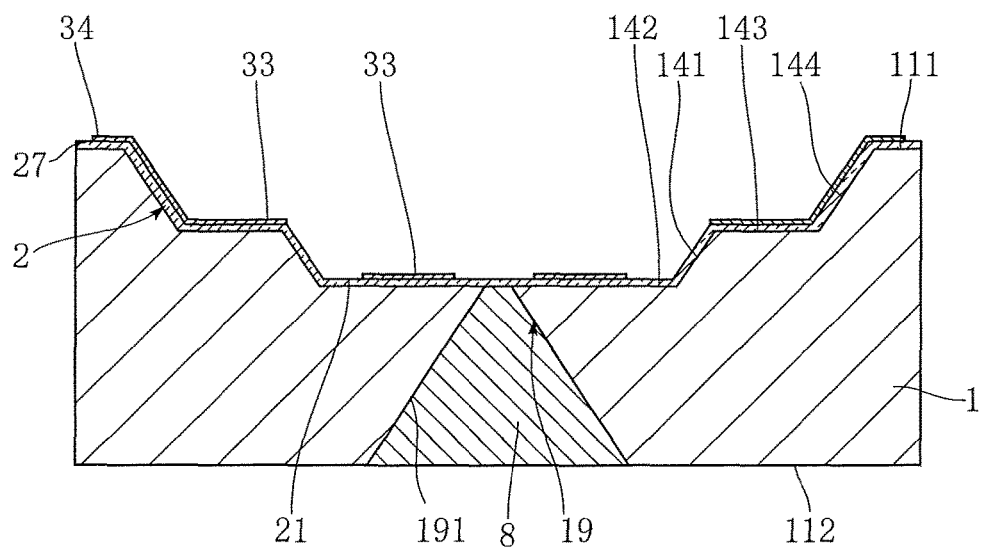
FIG. 13 is a cross-sectional view showing an example of the method for manufacturing the magnetism detection device shown in FIG. 1.

Next, the conducting layer 3 is formed as shown in FIG. 13. The formation of the conducting layer 3 includes the formation of a seed layer and a plating layer. The seed layer is formed by performing sputtering using Cu and then carrying out patterning, for example. The plating layer is formed through electrolytic plating using the seed layer, for example. As a result, the plating layer, which is formed of Cu or a layer in which Ti, Ni, Cu, and the like are stacked, for example, is obtained. The seed layer and the plating layer form the conducting layer 3 by being stacked. At this time, the conducting layer 3 has a shape in which the element arrangement recessed portion pads 33 and the main surface side pads 34 are included, for example.

Figure 14:
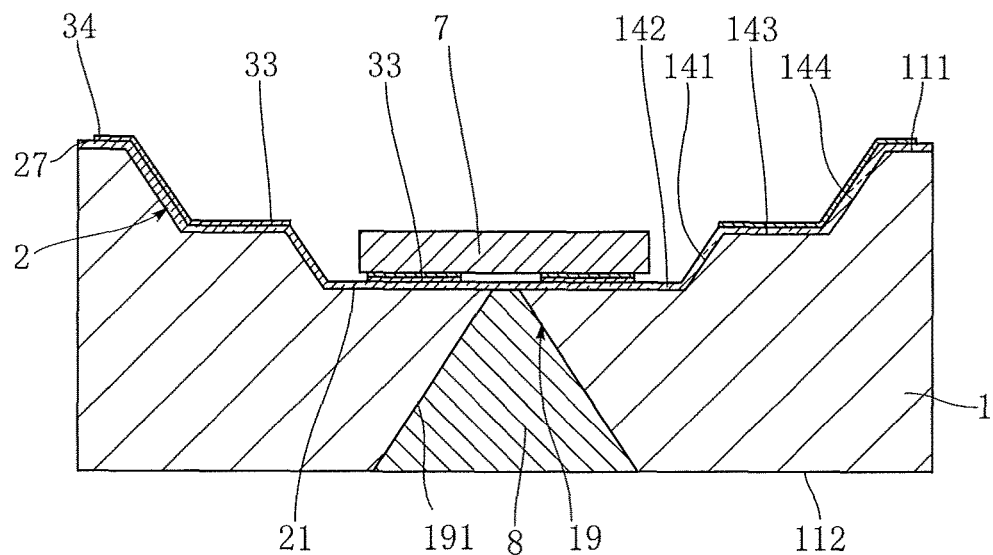
FIG. 14 is a cross-sectional view showing an example of the method for manufacturing the magnetism detection device shown in FIG. 1.

Next, the magneto-impedance elements 7 are arranged in the element arrangement recessed portion 14 as shown in FIG. 14. More specifically, the magneto-impedance elements 7 are mounted on the element arrangement recessed portion bottom surface 142. Solder balls, for example, are formed on the magneto-impedance elements 7. The solder balls are coated with flax. Using the adhesiveness of the flax, the magneto-impedance elements 7 are mounted on the element arrangement recessed portion pads 33 of the element arrangement recessed portion bottom surface 142. Also, the arrangement of the magneto-impedance elements 7 is completed by melting the solder balls with a reflow oven and then allowing them to solidify. Instead of the method of forming solder balls, it is possible to use a method of coating the element arrangement recessed portion pads 33 of the conducting layer 3 with a solder paste.

Figure 15:
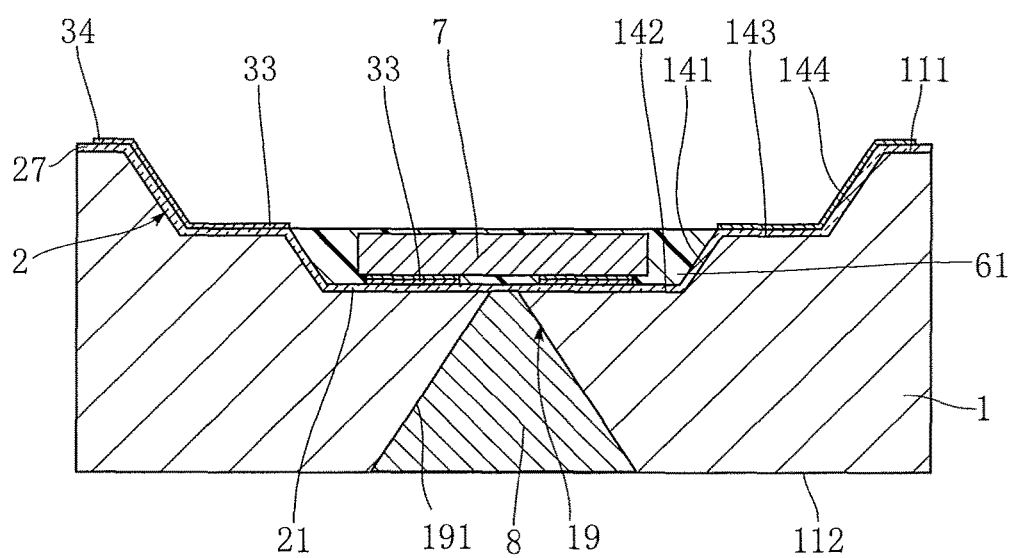
FIG. 15 is a cross-sectional view showing an example of the method for manufacturing the magnetism detection device shown in FIG. 1.

Next, the first sealing resin portion 61 is formed as shown in FIG. 15. The first sealing resin portion 61 is formed by filling the space surrounded by the element arrangement recessed portion bottom surface 142 and the element arrangement recessed portion first side surfaces 141 with a resin material that has excellent permeability and is cured through light exposure, for example, so as to cover the magneto-impedance elements 7, and then curing the resin material.

Figure 16:
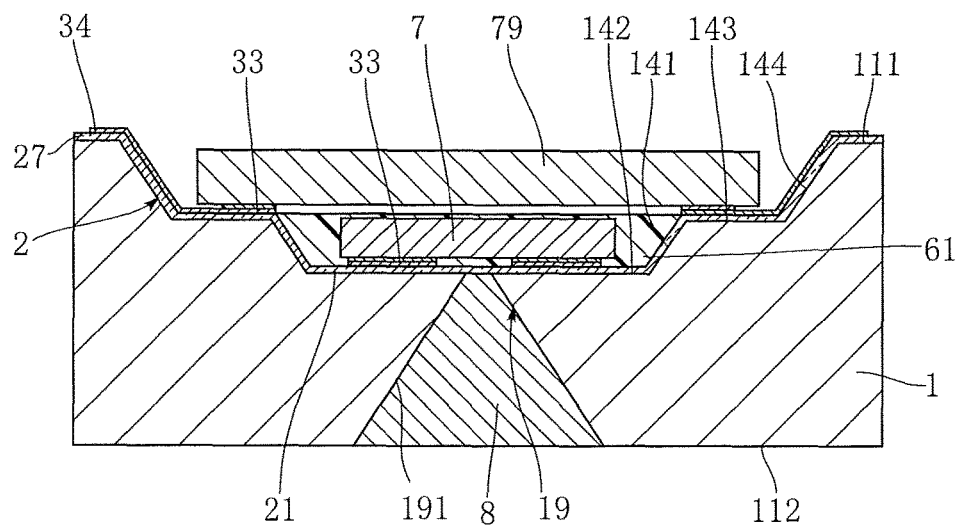
FIG. 16 is a cross-sectional view showing an example of the method for manufacturing the magnetism detection device shown in FIG. 1.

Next, the control element 79 is arranged in the element arrangement recessed portion 14 as shown in FIG. 16. More specifically, the control element 79 is mounted on the element arrangement recessed portion intermediate surface 143. Solder balls, for example, are formed on the control element 79. The solder balls are coated with flax. Using the adhesiveness of the flax, the control element 79 is mounted on the element arrangement recessed portion pads 33 of the element arrangement recessed portion intermediate surface 143. Also, the arrangement of the control element 79 is completed by melting the solder balls with a reflow oven and then allowing them to solidify. Instead of the method of forming solder balls, it is possible to use a method of coating the element arrangement recessed portion pads 33 of the conducting layer 3 with a solder paste.

Figure 17:
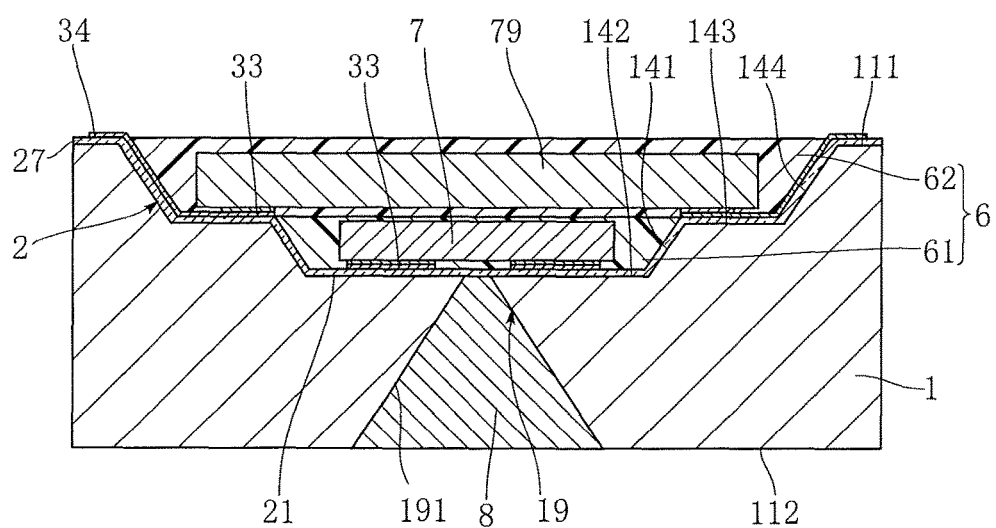
FIG. 17 is a cross-sectional view showing an example of the method for manufacturing the magnetism detection device shown in FIG. 1.

Next, the second sealing resin portion 62 is formed as shown in FIG. 17. The second sealing resin portion 62 is formed by filling the space surrounded by the element arrangement recessed portion intermediate surface 143 and the element arrangement recessed portion second side surfaces 144 with a resin material that has excellent permeability and is cured through light exposure, for example, so as to cover the control element 79, and then curing the resin material.

Figure 18:
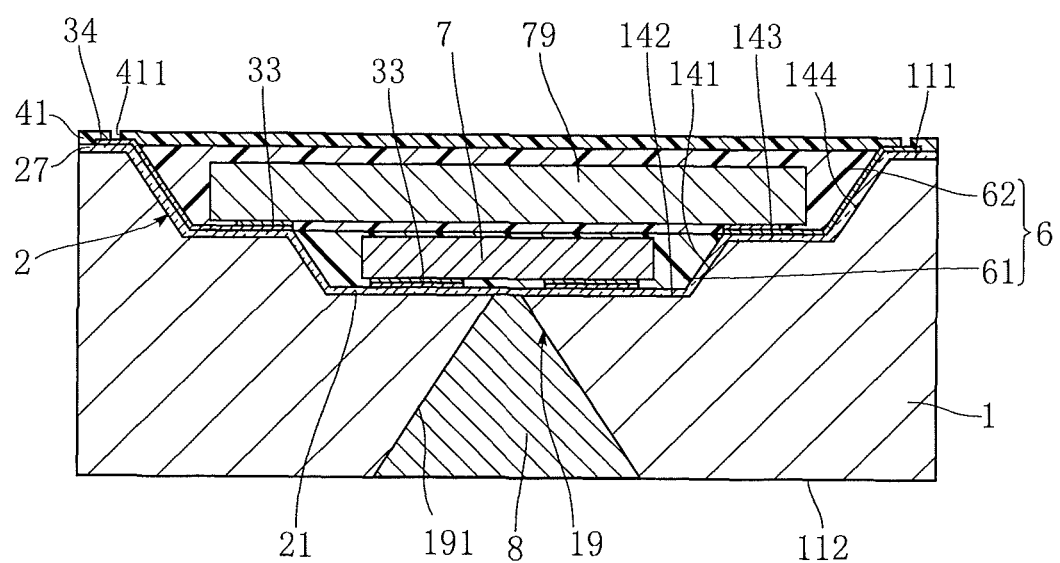
FIG. 18 is a cross-sectional view showing an example of the method for manufacturing the magnetism detection device shown in FIG. 1.

Next, the main surface side insulating film 41 is formed as shown in FIG. 18. The main surface side insulating film 41 is formed by performing CVD using SiN, for example, and then carrying out patterning. At this time, the through-holes 411 are formed in the main surface side insulating film 41.

Thereafter, the main surface electrode pads 51 are formed. The main surface electrode pads 51 are formed through non-electrolytic plating with a metal such as Ni, Pd, or Au, for example.

Then, the substrate 1 is cut with a dicer, for example, whereby the magnetism detection device A1 shown in FIGS. 1 to 3 is obtained.

Note that aside from the method described above, the magnetic field direction changing bodies 8 may be formed through plating, for example. In the case of firing the paste including the permalloy, the magneto-impedance elements 7 and the control element 79 are mounted after the firing since the firing temperature is high. In the case of using plating, it is also possible to form the magnetic field direction changing bodies 8 after the magneto-impedance elements 7 and the control element 79 are mounted.

Next, effects of the magnetism detection device A1 will be described.

According to the present invention, the magnetic field direction changing bodies 8 are accommodated in through-holes 19 with cross-sectional dimensions that increase toward the back surface 112 side starting from the element arrangement recessed portion bottom surface 142. According to this, the direction of the magnetic flux is changed such that the density is increased at the portion of the magnetic field direction changing bodies 8 on the element arrangement recessed portion bottom surface 142 side and spreads out significantly from the end portion of the magnetic field direction changing bodies 8 to the outside. This makes it possible to more accurately detect magnetism along the thickness direction of the substrate 1 and magnetism in the direction in which the wires 72 extend, which is different from the thickness direction. Also, due to the magnetic field direction changing bodies 8 being smaller in cross-section on the element arrangement recessed portion bottom surface 142 side, smaller-sized magneto-impedance elements 7 can be used as the magneto-impedance elements 7 arranged in correspondence therewith. Accordingly, it is possible to achieve a reduction in the size and an increase in the accuracy of the magnetism detection device A1.

By accommodating the magneto-impedance elements 7 and the control element 79 in the element arrangement recessed portion 14 in a stacked manner, it is possible to reduce the size of the magnetism detection device A1 in the thickness direction of the substrate 1.

Using the substrate 1, which is made of Si, (100) surfaces are selected as the main surface 111 and the back surface 112, and thereby it is possible to use significantly smooth surfaces for the element arrangement recessed portion first side surfaces 141, the element arrangement recessed portion second side surfaces 144, and the through-hole inner surfaces 191. This is advantageous in that the conducting layer 3 can be formed appropriately on the element arrangement recessed portion first side surfaces 141 and the element arrangement recessed portion second side surfaces 144. Also, it is suitable for finishing the magnetic field direction changing bodies 8 into desired regular pyramid shapes. The more accurate the shapes of the magnetic field changing bodies 8 are, the more accurate the positioning of the magneto-impedance elements 7 is, which is preferable for increasing the accuracy of the magnetism detection device A1.

Accommodating two magneto-impedance elements 7 in one element arrangement recessed portion 14 is favorable for achieving a reduction in the size of the magnetism detection device A1, and magnetism in three directions can be detected with one magnetism detection device A1.

Figure 19:
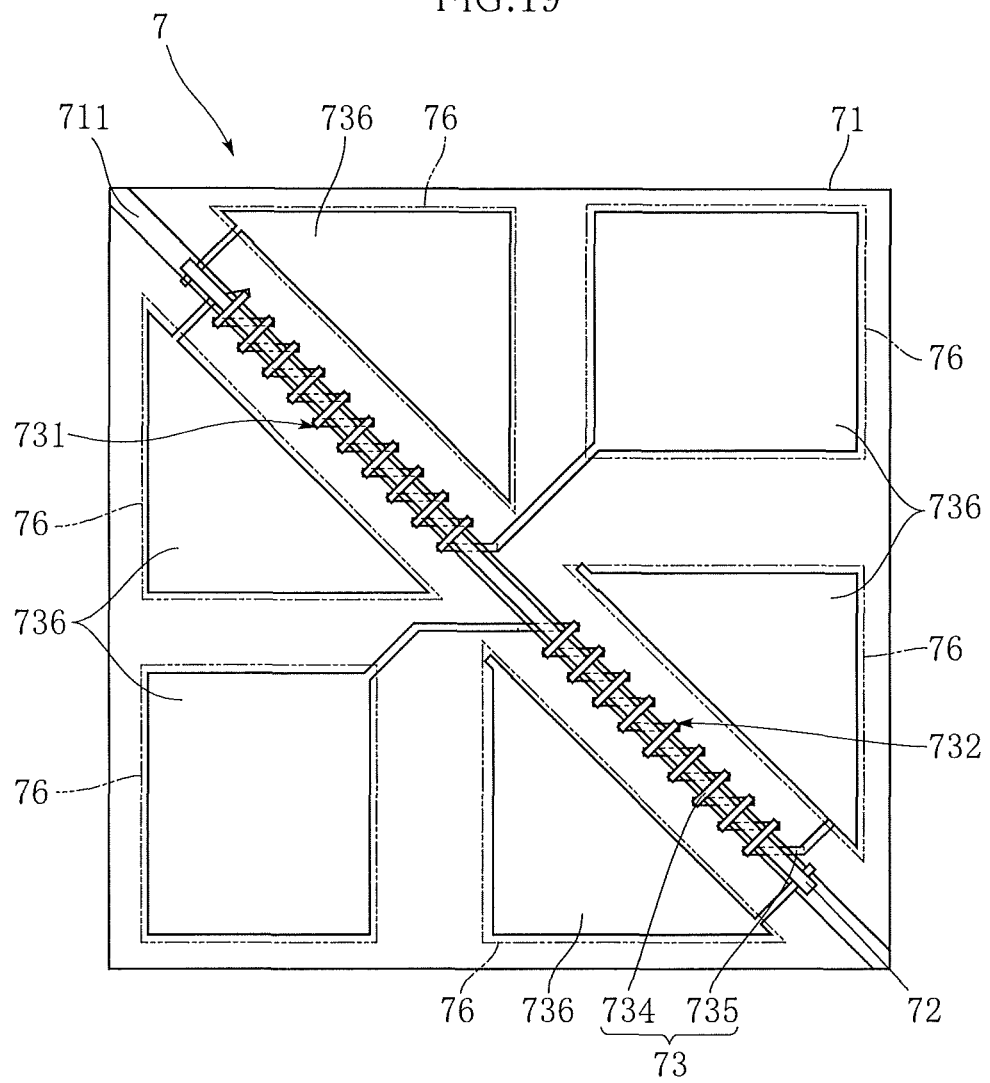
FIG. 19 is a plan view showing relevant portions of another example of a magneto-impedance element of the magnetism detection device shown in FIG. 1.

FIG. 19 shows a modified example of a magneto-impedance element 7 used in the magnetism detection device A1. Note that in this drawing, elements that are the same as or similar to those in the above-described embodiment are denoted by the same reference numerals as in the above-described embodiment.

In the present modified example, the magneto-impedance element 7 is provided with one wire 72. A portion on one side of the wire 72 is accommodated in a coil 731, and the portion on the other side is accommodated in a coil 732. In the present modified example as well, the magneto-impedance element 7 is provided with six pad portions 736 and six electrode pads 76.

According to this modified example as well, it is possible to achieve a reduction in the size and an increase in the accuracy of the magnetism detection device A1.

The magnetism detection device according to the present invention is not limited to the above-described embodiments. Specific configurations of the parts of the magnetism detection device of the present invention can be designed and modified in various ways.

The invention claimed is:
1. A magnetism detection device comprising:
at least one magneto-impedance element;
a magnetic field direction changing body; and
a substrate that is formed of a semiconductor material and has a mounting surface and a back surface that face mutually opposite sides in a thickness direction, and at least one through-hole that reaches the mounting surface and the back surface and has a cross-sectional dimension that increases toward the back surface starting from the mounting surface,
wherein the magneto-impedance element is mounted on the mounting surface,
the magnetic field direction changing body is accommodated in the through-hole,
the substrate has a side surface surrounding one of the at least one magneto-impedance element,
the through-hole has a through-hole inner surface surrounding the magnetic field direction changing body, and
a first angle of the side surface of the substrate to a plane along the mounting surface of the substrate is same as a second angle of the through-hole inner surface to the plane along the mounting surface of the substrate, each of the first and second angles being larger than 0 degree and smaller than 90 degrees.

2. The magnetism detection device according to claim 1, wherein the substrate further includes a main surface facing a side opposite to the back surface, and an element arrangement recessed portion that is recessed from the main surface and has an element arrangement recessed portion bottom surface,
the mounting surface is the element arrangement recessed portion bottom surface, and the element arrangement recessed portion bottom surface is disposed between the magnetic field direction changing body and one of the at least one magneto-impedance element.

3. The magnetism detection device according to claim 2, wherein the element arrangement recessed portion bottom surface is orthogonal to the thickness direction.

4. The magnetism detection device according to claim 3, wherein the element arrangement recessed portion has an element arrangement recessed portion first side surface that rises from the element arrangement recessed portion bottom surface, and
the side surface of the substrate is the element arrangement recessed portion first side surface.

5. The magnetism detection device according to claim 4, wherein the element arrangement recessed portion first side surface is inclined with respect to the thickness direction.

6. The magnetism detection device according to claim 5, wherein the element arrangement recessed portion has an element arrangement recessed portion intermediate surface that is connected to the element arrangement first side surface and faces the same side as the element arrangement recessed portion bottom surface.

7. The magnetism detection device according to claim 6, further comprising a control element configured to perform magnetism detection control using the magneto-impedance element,
wherein the control element is mounted on the element arrangement recessed portion intermediate surface.

8. The magnetism detection device according to claim 7, wherein the element arrangement recessed portion is rectangular in a view in the thickness direction.

9. The magnetism detection device according to claim 8, further comprising an insulating layer formed on the substrate and a conducting layer that is formed on the insulating layer and electrically connects to the magneto-impedance element and the control element.

10. The magnetism detection device according to claim 9, wherein the insulating layer comprises $SiO_2$ or SiN.

11. The magnetism detection device according to claim 9, wherein the insulating layer includes a recessed portion inner surface insulating portion formed on an inner surface of the element arrangement recessed portion.

12. The magnetism detection device according to claim 9, wherein the conducting layer is formed over the element arrangement recessed portion bottom surface, the element arrangement recessed portion first side surface, and the element arrangement recessed portion intermediate surface.

13. The magnetism detection device according to claim 12, wherein the conducting layer is formed over the element arrangement recessed portion intermediate surface, the element arrangement recessed portion second side surface, and the main surface.

14. The magnetism detection device according to claim 2, wherein the magnetic field direction changing body fills an entire inner space of the through-hole.

15. The magnetism detection device according to claim 14, wherein the magnetic field direction changing body is formed of a soft magnetic body.

16. The magnetism detection device according to claim 15, wherein the soft magnetic body is a permalloy.

17. The magnetism detection device according to claim 2, wherein the magneto-impedance element includes at least one wire, and at least one coil that is insulated from the wire and in which the wire is accommodated.

18. The magnetism detection device according to claim 17, wherein the wire is arranged along the mounting surface.

19. The magnetism detection device according to claim 17, further comprising an additional coil in which the wire is accommodated, wherein the additional coil is arranged apart from the at least one coil in a longitudinal direction of the wire.

20. The magnetism detection device according to claim 19, wherein the magneto-impedance element includes an additional wire arranged parallel to the at least one wire.

21. The magnetism detection device according to claim 20, wherein the at least one coil and the additional coil accommodate the additional wire.

22. The magnetism detection device according to claim 2, further comprising an additional magneto-impedance element, wherein the substrate has an additional through-hole, and the at least one magneto-impedance element and the additional magneto-impedance element correspond to the at least one through-hole and the additional through-hole and have mutually different detection directions.

23. The magnetism detection device according to claim 2, wherein the substrate is formed of a single-crystal semiconductor material.

24. The magnetism detection device according to claim 23, wherein the semiconductor material is Si.

25. The magnetism detection device according to claim 24, wherein the mounting surface and the back surface are orthogonal to the thickness direction of the substrate and are flat.

26. The magnetism detection device according to claim 25, wherein the mounting surface and the back surface are (100) surfaces.

27. A magnetism detection device comprising:
at least one magneto-impedance element;
a magnetic field direction changing body; and
a substrate that is formed of a semiconductor material and has a mounting surface and a back surface that face mutually opposite sides in a thickness direction, and at least one through-hole that reaches the mounting surface and the back surface and has a cross-sectional dimension that increases toward the back surface starting from the mounting surface,
wherein the magneto-impedance element is mounted on the mounting surface,
the magnetic field direction changing body is accommodated in the through-hole,
the substrate further includes a main surface facing a side opposite to the back surface, and an element arrangement recessed portion that is recessed from the main surface and has an element arrangement recessed portion bottom surface,
the mounting surface is the element arrangement recessed portion bottom surface,
the element arrangement recessed portion bottom surface is orthogonal to the thickness direction,
the element arrangement recessed portion has an element arrangement recessed portion first side surface that rises from the element arrangement recessed portion bottom surface,
the element arrangement recessed portion first side surface is inclined with respect to the thickness direction,
the element arrangement recessed portion has an element arrangement recessed portion intermediate surface that is connected to the element arrangement first side surface and faces the same side as the element arrangement recessed portion bottom surface,
the magnetism detection device further comprises a control element configured to perform magnetism detection control using the magneto-impedance element, the control element is mounted on the element arrangement recessed portion intermediate surface, and the element arrangement recessed portion has an element arrangement recessed portion second side surface that rises from the element arrangement recessed portion intermediate surface.

28. The magnetism detection device according to claim 27, wherein the element arrangement recessed portion second side surface is inclined with respect to the thickness direction.

29. A magnetism detection device comprising:
at least one magneto-impedance element;
a magnetic field direction changing body; and
a substrate that is formed of a semiconductor material and has a mounting surface and a back surface that face mutually opposite sides in a thickness direction, and at least one through-hole that reaches the mounting surface and the back surface and has a cross-sectional dimension that increases toward the back surface starting from the mounting surface,
wherein the magneto-impedance element is mounted on the mounting surface, the magnetic field direction changing body is accommodated in the through-hole, the substrate further includes a main surface facing a side opposite to the back surface, and an element arrangement recessed portion that is recessed from the main surface and has an element arrangement recessed portion bottom surface, the mounting surface is the element arrangement recessed portion bottom surface, the magnetism detection device further comprises an additional magneto-impedance element, wherein the substrate has an additional through-hole, and the at least one magneto-impedance element and the additional magneto-impedance element correspond to the at least one through-hole and the additional through-hole and have mutually different detection directions, and the at least one magneto-impedance element and the additional magneto-impedance element are both arranged on the element arrangement recessed portion.

* * * * *